United States Patent
Moshe

(10) Patent No.: US 11,725,989 B2
(45) Date of Patent: Aug. 15, 2023

(54) MICROELECTROMECHANICAL SYSTEM (MEMS) AND (MEM) OPTICAL INTERFEROMETER FOR HYPER-SPECTRAL IMAGING AND ANALYSIS

(71) Applicant: Green Vision Systems Ltd., Tel-Aviv (IL)

(72) Inventor: Danny S. Moshe, Tel-Aviv (IL)

(73) Assignee: Green Vision Systems Ltd., Tel-Aviv (IL)

( * ) Notice: Subject to any disclaimer, the term of this patent is extended or adjusted under 35 U.S.C. 154(b) by 0 days.

(21) Appl. No.: 16/283,888

(22) Filed: Feb. 25, 2019

(65) Prior Publication Data

US 2019/0277698 A1 Sep. 12, 2019

Related U.S. Application Data

(63) Continuation of application No. 14/115,414, filed as application No. PCT/IB2012/052195 on May 2, 2012, now abandoned.
(Continued)

(51) Int. Cl.
*G01J 3/45* (2006.01)
*G01J 3/02* (2006.01)
(Continued)

(52) U.S. Cl.
CPC ............ *G01J 3/45* (2013.01); *B81B 7/02* (2013.01); *G01B 9/02049* (2013.01);
(Continued)

(58) Field of Classification Search
CPC .......... G01J 3/45; G01J 3/0256; G01J 3/4535; G01J 3/0208; G01J 3/0202;
(Continued)

(56) References Cited

U.S. PATENT DOCUMENTS 5,440,388 A * 8/1995 Erickson ............ A61B 5/7257
356/456
5,880,830 A 3/1999 Schechter
(Continued)

FOREIGN PATENT DOCUMENTS

WO WO 03/085371 10/2003
WO WO 2007/099540 9/2007
(Continued)

OTHER PUBLICATIONS

International Preliminary Report on Patentability dated Nov. 14, 2013 From the International Bureau of WIPO Re. Application No. PCT/IB2012/052195.
(Continued)

*Primary Examiner* — Hwa Andrew Lee

(57) ABSTRACT

A microelectromechanical system (MEMS) (10), and a microelectromechanical (MEM) optical interferometer (18), for hyper-spectral imaging and analysis. System (10) includes matrix configured collimating micro lens (16), for receiving and collimating electromagnetic radiation (60) emitted by objects (12) in a scene or sample (14); microelectromechanical optical interferometer (18), for forming divided collimated object emission beam (72) having an optical path difference, and for generating an interference image exiting optical interferometer (18); matrix configured focusing micro lens (20); micro detector (22), for detecting and recording generated interference images; and micro central programming and signal processing unit (24). Applicable for on-line (e.g., real time or near-real time) or off-line hyper-spectral imaging and analyzing, on a miniaturized or 'micro' (sub-centimeter [1 cm (10 mm) or less], or sub-millimeter) scale, essentially any types or kinds of biological, physical, or/and chemical, (i.e., biophysicochemical) objects.

4 Claims, 4 Drawing Sheets

Exemplary embodiment of manufacturing an exemplary micro piezoelectric motor and micro movable mirror, via a MEMS technique.

Microfabricate slide mechanism and micro movable mirror.

Related U.S. Application Data

(60) Provisional application No. 61/481,269, filed on May 2, 2011.

(51) Int. Cl.

| | | |
|---|---|---|
| *G01J 3/453* | (2006.01) | |
| *G02B 26/06* | (2006.01) | |
| *B81B 7/02* | (2006.01) | |
| *G01B 9/02* | (2022.01) | |
| *G02B 7/182* | (2021.01) | |

(52) U.S. Cl.
CPC ........... *G01J 3/0208* (2013.01); *G01J 3/0256* (2013.01); *G01J 3/4535* (2013.01); *G02B 26/06* (2013.01); *G02B 7/182* (2013.01)

(58) Field of Classification Search
CPC ...... G01J 2003/064; G01J 3/06; G02B 26/06; G02B 7/182; G02B 3/0056; B81B 7/02; G01B 9/02049
See application file for complete search history.

(56) References Cited

U.S. PATENT DOCUMENTS

| | | | |
|---|---|---|---|
| 6,005,664 A * | 12/1999 | Korenberg | G01J 9/02 |
| | | | 356/451 |
| 6,091,843 A | 7/2000 | Horesh et al. | |
| 6,438,261 B1 | 8/2002 | Moshe et al. | |
| 6,694,048 B2 | 2/2004 | Moshe | |
| 6,697,510 B2 | 2/2004 | Moshe | |
| 7,359,058 B2 * | 4/2008 | Kranz | G01J 3/4532 |
| | | | 356/452 |
| 7,411,682 B2 | 8/2008 | Moshe | |
| 8,780,356 B1 * | 7/2014 | Saari | G01J 3/2803 |
| | | | 356/454 |
| 2003/0048442 A1* | 3/2003 | Xiao | G01J 3/04 |
| | | | 356/328 |
| 2009/0122383 A1 | 5/2009 | Reyes et al. | |
| 2011/0058176 A1* | 3/2011 | Pflugl | B82Y 20/00 |
| | | | 356/451 |
| 2011/0222067 A1* | 9/2011 | Saadany | G01B 7/08 |
| | | | 359/872 |
| 2014/0078509 A1 | 3/2014 | Moshe | |

FOREIGN PATENT DOCUMENTS

| | | |
|---|---|---|
| WO | WO 2008/099407 | 8/2008 |
| WO | WO 2008/148237 | 12/2008 |
| WO | WO 2012/150557 | 11/2012 |
| WO | WO-2018168944 A1 * | 9/2018 ............... B81B 3/00 |

OTHER PUBLICATIONS

International Search Report and the Written Opinion dated Aug. 27, 2012 From the International Searching Authority Re. Application No. PCT/IB2012/052195.
Notice of Non-Compliant Amendment dated Sep. 8, 2016 From the Re. U.S. Appl. No. 14/115,414.
Official Action dated Feb. 9, 2018 From the Re. U.S. Appl. No. 14/115,414. (22 pages).
Official Action dated Feb. 16, 2017 From the Re. U.S. Appl. No. 14/115,414. (22 pages).
Official Action dated Oct. 25, 2018 From the Re. U.S. Appl. No. 14/115,414. (22 pages).
Official Action dated Jan. 30, 2017 From the Re. U.S. Appl. No. 14/115,414. (20 pages).
Restriction Official Action dated Dec. 9, 2015 From the Re. U.S. Appl. No. 14/115,414.
Translation Dated Mar. 26, 2019 of Office Action dated Feb. 12, 2019 From the Israel Patent Office Re. Application No. 229213. (2 Pages).
Levy et al. "A Concept for Zero-Alignment Micro Optical Systems", In Micromachine Technology for Diffractive and Holographic Optics, International Society for Optics and Photonics, 3879: 167-174, 1999.

* cited by examiner

Exemplary embodiment of manufacturing an exemplary micro piezoelectric motor and micro movable mirror, via a MEMS technique.

MICROELECTROMECHANICAL SYSTEM (MEMS) AND (MEM) OPTICAL INTERFEROMETER FOR HYPER-SPECTRAL IMAGING AND ANALYSIS

RELATED APPLICATIONS

This application is a continuation of U.S. patent application Ser. No. 14/115,414 filed on Nov. 4, 2013, which is a National Phase of PCT Patent Application No. PCT/IB2012/052195 having International Filing Date of May 2, 2012, which claims the benefit of priority under 35 USC § 119(e) of U.S. Provisional Patent Application No. 61/481,269 filed on May 2, 2011.

The contents of the above applications are all incorporated by reference as if fully set forth herein in their entirety.

FIELD OF THE INVENTION

The present invention, in some embodiments thereof, relates to the fields of hyper-spectral imaging and analysis, and microelectromechanical systems (MEMS) and microelectromechanical (MEM) components thereof, and more particularly, but not exclusively, to a microelectromechanical system (MEMS) for hyper-spectral imaging and analysis, and a microelectromechanical (MEM) optical interferometer for hyper-spectral imaging and analysis.

Exemplary embodiments of the present invention are generally applicable for on-line (e.g., real time or near-real time) or off-line hyper-spectral imaging and analyzing, on a miniaturized or 'micro' (sub-centimeter [1 cm (10 mm) or less], or sub-millimeter) scale, essentially any type or kind of biological, physical, or/and chemical, (i.e., biophysicochemical) object (entity, material, substance, or structure), wherein the object is composed or made up of essentially any type, kind, and number of species or components, which in turn, are made up of essentially any type, kind, and number of organic or/and inorganic materials or substances. Some exemplary embodiments of the present invention are particularly applicable for hyper-spectral imaging and analyzing objects that are included in food products (and raw materials thereof), in agricultural products (e.g., plant matter, in raw or processed (finished) form), in environmental matter (e.g., contaminated air (e.g., aerosol), water, or ground), or in pharmaceutical products (and raw materials thereof). Exemplary embodiments of the present invention are generally applicable to essentially any field or area of technology which requires, or/and involves, hyper-spectrally imaging and analyzing objects on a miniaturized or micro (sub-centimeter, or sub-millimeter) scale.

BACKGROUND OF THE INVENTION

Hyper-Spectral Imaging and Analysis

Hyper-spectral imaging and analysis has been established as a highly unique, specialized, and sophisticated, combined spectroscopy and imaging type of analytical method or technique, in the more encompassing field or area of analytical science and technology, involving the sciences and technologies of spectroscopy and imaging. By definition, hyper-spectral imaging and analysis is based on a combination of spectroscopy and imaging theories, principles, and practices, which are exploitable for analyzing and classifying samples of biological, physical, or/and chemical, (i.e., biophysicochemical), matter in a highly unique, specialized, and sophisticated, manner.

Hyper-spectral imaging, in general, generating and collecting hyper-spectral images, and, processing and analyzing hyper-spectral image data and information, in particular, theory, principles, and practices thereof, and, related and associated applications and subjects thereof, such as the more general subject of spectral imaging, are well known and taught about in scientific, technical, and patent, literature, and currently practiced in a wide variety of numerous different fields and areas of science and technology. Selected teachings and practices of hyper-spectral imaging and analysis by the same applicant/assignee of the present invention are disclosed in references 1-8 (and references cited therein).

In sharp contrast to the regular or standard spectroscopic imaging technique of 'spectral' imaging and analysis, the more highly specialized, complex, and sophisticated, spectroscopic imaging technique of 'hyper-spectral' imaging and analysis, consists of using a hyper-spectral imaging and analysis system for on-line (real time, near-real time) or off-line generating and collecting (acquiring) hyper-spectral images and spectra (herein, together, generally referred to as hyper-spectral image data and information), and, processing and analyzing the acquired hyper-spectral image data and information. In hyper-spectral imaging, multiple fields of view of an object (and components thereof) (for example, included in a scene or sample of matter) are 'hyper-spectrally' scanned and imaged while the object (and components thereof) is exposed to electromagnetic radiation.

During the hyper-spectral scanning and imaging there is generating and collecting relatively large numbers (up to the order of millions) of multiple spectral (i.e., hyper-spectral) images, 'one-at-a-time', but, in an extremely fast or rapid sequential manner, of the objects (and components thereof) emitting electromagnetic radiation at a plurality of many wavelengths (or frequencies, or energies), where the wavelengths (or frequencies, or energies) are associated with different selected (relatively narrow) portions or bands, or bands therein, of an entire hyper-spectrum emitted by the objects (and components thereof). A hyper-spectral imaging and analysis system can be operated in an extremely fast or rapid manner for providing exceptionally highly resolved spectral and spatial data and information of an imaged object (and components thereof), with high accuracy and high precision (reproducibility), which are fundamentally unattainable by using a regular or standard spectral imaging and analysis system.

In general, when electromagnetic radiation, for example, in the form of light such as that supplied by the sun, or by a man-made imaging type of illuminating or energy source, such as that used during hyper-spectral imaging, is incident upon an object, the electromagnetic radiation is affected by one or more of the biological, physical, or/and chemical, (biophysicochemical) species or components making up the object, by any combination of electromagnetic radiation absorption, diffusion, reflection, diffraction, scattering, or/and transmission, mechanisms. Moreover, an object whose composition includes organic chemical species or components, ordinarily exhibits some degree or extent of fluorescent or/and phosphorescent properties, characteristics, and behavior, when illuminated by some type of electromagnetic radiation or light, such as ultra-violet (UV), visible (VIS), or infrared (IR), types of light. The affected electromagnetic radiation, in the form of diffused, reflected, diffracted, scattered, or/and transmitted, electromagnetic radiation emitted by, or/and emerging from, the object (and components thereof), is directly and uniquely related to, and can be correlated with, the biological, physical, chemical, (biophysicochemical) properties, characteristics, and behavior, of the object, in general, and of the biological, physical, or/and chemical, (biophysicochemical) species or components making up the object, in particular, and therefore represents a spectral ('fingerprint' or 'signature') pattern type of identification and characterization of the object, which is directly applicable for analyzing and classifying the object.

Accordingly, hyper-spectral images generated by, and collected from, an object (and components thereof) are correlated with emission spectra of the object (and components thereof), where the emission spectra correspond to spectral representations in the form of spectral 'fingerprint' or 'signature' pattern types of identification and characterization, of the hyper-spectrally imaged object (and components thereof). Such hyper-spectral image data and information are processed and analyzed by using automatic pattern recognition (APR) or/and optical character recognition (OCR) types of hyper-spectral imaging data and information processing and analysis, for identifying, characterizing, or/and classifying, the biological, physical, or/and chemical, (biophysicochemical) properties, characteristics, and behavior, and, species or components, of the hyper-spectrally imaged object (and components thereof).

Hyper-Spectral Imaging and Analysis on a Miniaturized 'Micro' (Sub-Centimeter, or Sub-Millimeter) Scale Exemplary embodiments of a system, method, and optical interferometer, for real time high speed high resolution hyper-spectral imaging are illustratively described in same applicant/assignee U.S. Pat. No. 7,411,682 (reference 3). Such exemplary embodiments are well suited for high speed high resolution hyper-spectral imaging and analysis of objects on a 'macro' (larger than one centimeter) scale. However, such exemplary embodiments are limited in applications requiring or/and involving high speed high resolution hyper-spectral imaging and analyzing on a miniaturized or 'micro' (sub-centimeter [1 cm (10 mm) or less], or sub-millimeter) scale. Main limitations relate to size and dimensional aspects of the various electromechanical or/and optical design, structural, and functional (operational), characteristics, properties, and features, of the optical interferometer as part of the overall hyper-spectral imaging and analysis system.

Thus, there is a need for, and it would be highly advantageous and useful to have a microelectromechanical system (MEMS) for hyper-spectral imaging and analysis, and a microelectromechanical (MEM) optical interferometer for hyper-spectral imaging and analysis. There is need for such an invention whose exemplary embodiments are generally applicable for on-line (e.g., real time or near-real time) or off-line hyper-spectral imaging and analyzing, on a miniaturized or 'micro' (sub-centimeter [1 cm (10 mm) or less], or sub-millimeter) scale, essentially any type or kind of biological, physical, or/and chemical, (i.e., biophysicochemical) object (entity, material, substance, or structure), wherein the object is composed or made up of essentially any type, kind, and number of species or components, which in turn, are made up of essentially any type, kind, and number of organic or/and inorganic materials or substances. There is further need for such an invention having some exemplary embodiments particularly applicable for hyper-spectral imaging and analyzing objects that are included in food products (and raw materials thereof), in agricultural products (e.g., plant matter, in raw or processed (finished) form), in environmental matter (e.g., contaminated air (aerosol), water, or ground), or in pharmaceutical products (and raw materials thereof). There is also need for such an invention whose exemplary embodiments are generally applicable to essentially any field or area of technology which requires, or/and involves, hyper-spectrally imaging and analyzing objects on a miniaturized or micro (sub-centimeter, or sub-millimeter) scale.

SUMMARY OF THE INVENTION

The present invention, in some embodiments thereof, relates to the fields of hyper-spectral imaging and analysis, and microelectromechanical systems (MEMS) and microelectromechanical (MEM) components thereof, and more particularly, but not exclusively, to a microelectromechanical system (MEMS) for hyper-spectral imaging and analysis, and a microelectromechanical (MEM) optical interferometer for hyper-spectral imaging and analysis for hyper-spectral imaging and analysis.

Exemplary embodiments of the present invention are generally applicable for on-line (e.g., real time or near-real time) or off-line hyper-spectral imaging and analyzing, on a miniaturized or 'micro' (sub-centimeter [1 cm (10 mm) or less], or sub-millimeter) scale, essentially any type or kind of biological, physical, or/and chemical, (i.e., biophysicochemical) object (entity, material, substance, or structure), wherein the object is composed or made up of essentially any type, kind, and number of species or components, which in turn, are made up of essentially any type, kind, and number of organic or/and inorganic materials or substances. Some exemplary embodiments of the present invention are particularly applicable for hyper-spectral imaging and analyzing objects that are included in food products (and raw materials thereof), in agricultural products (e.g., plant matter, in raw or processed (finished) form), in environmental matter (e.g., contaminated air (aerosol), water, or ground), or in pharmaceutical products (and raw materials thereof). Exemplary embodiments of the present invention are generally applicable to essentially any field or area of technology which requires, or/and involves, hyper-spectrally imaging and analyzing objects on a miniaturized or micro (sub-centimeter, or sub-millimeter) scale.

Exemplary embodiments of the present invention address and overcome at least some limitations of teachings of hyper-spectral imaging and analysis objects, as applied to a miniaturized or micro (sub-centimeter, or sub-millimeter) scale.

Thus, according to a main aspect of some embodiments of the present invention, there is provided a microelectromechanical system for hyper-spectral imaging and analysis, comprising: a matrix configured collimating micro lens, configured and suitable for receiving and collimating electromagnetic radiation emitted by objects in a scene or a sample, thereby forming a collimated object emission beam; a microelectromechanical optical interferometer, configured and operatively positioned relative to the matrix configured collimating micro lens, and suitable for receiving and dividing the collimated object emission beam, for forming a divided collimated object emission beam having an optical path difference, and for generating an interference image exiting the optical interferometer; a matrix configured focusing micro lens; a micro detector, configured and operatively positioned relative to the microelectromechanical optical interferometer, and suitable for detecting and recording each generated interference image, for forming a plurality of recorded interference images; and a micro central programming and control/data/information signal processing unit (micro-CPPU).

According to some embodiments, the microelectromechanical optical interferometer includes: a micro beam splitter; a micro fixed mirror; a micro movable mirror; a micro piezoelectric motor; a micro distance change feedback sensor; a micro piezoelectric motor controller, configured and operatively connected to the micro piezoelectric motor and to the micro distance change feedback sensor; and a micro optical interferometer mount, configured and suitable as a mount of the micro beam splitter, the micro fixed mirror, the micro movable mirror, the micro piezoelectric motor, and the micro distance change feedback sensor.

According to another main aspect of some embodiments of the present invention, there is provided an microelectromechanical optical interferometer for hyper-spectral imaging and analysis, comprising: a micro beam splitter, onto which a collimated object emission beam of electromagnetic radiation emitted by objects in a scene or a sample is incident, and by which the collimated object emission beam is divided into two beams; a micro fixed mirror, configured and operatively positioned relative to the micro beam splitter; a micro movable mirror, configured and operatively positioned relative to the micro fixed mirror and to the micro beam splitter, whereby the micro fixed mirror and the micro movable mirror receive and reflect the two beams in a manner such that the two beams exiting the micro optical interferometer have an optical path difference; a micro piezoelectric motor, configured and operatively connected to the micro movable mirror, and suitable for displacing the micro movable mirror along an axis of the divided collimated object emission beam; a micro distance change feedback sensor, configured and operatively connected to the micro movable mirror, and suitable for sensing and measuring change in distance of the micro movable mirror along the axis; a micro piezoelectric motor controller, configured and operatively connected to the micro piezoelectric motor and to the micro distance change feedback sensor, and suitable for actuating and controlling the micro piezoelectric motor; and a micro optical interferometer mount, configured and suitable as a mount of the micro beam splitter, the micro fixed mirror, the micro movable mirror, the micro piezoelectric motor, and the micro distance change feedback sensor.

According to some embodiments of the present invention, the matrix configured collimating micro lens is configured and operatively positioned for being part of, and included in, the microelectromechanical optical interferometer.

According to some embodiments of the present invention, the micro optical interferometer mount is additionally configured and suitable as a mount of the matrix configured collimating micro lens.

According to some embodiments of the present invention, the micro beam splitter is selected from the group consisting of a rectangular shaped micro beam splitter and a cubic shaped micro beam splitter.

According to some embodiments of the present invention, in exemplary embodiments of the microelectromechanical optical interferometer, wherein the micro beam splitter is a cubic shaped micro beam splitter, the micro fixed mirror is configured, and operatively positioned, relative to the cubic shaped micro beam splitter, in a manner such that a distance (air gap or space) separates these components along their facing sides.

According to some embodiments of the present invention, the micro optical interferometer mount is made of a material including a micro etched surface.

According to some embodiments of the present invention, the material is selected from the group consisting of micro etchable semi-metallic materials, micro etchable non-metallic materials, and micro etchable metallic materials.

According to some embodiments of the present invention, the micro etchable semi-metallic material is selected from the group consisting of micro etchable silicon materials and micro etchable silicon-like materials.

According to some embodiments of the present invention, the micro etched surface of the material includes one or more micro etched portions whereupon are mounted at least one of the micro beam splitter, the micro fixed mirror, the micro movable mirror, the micro piezoelectric motor, and the micro distance change feedback sensor.

According to some embodiments of the present invention, the micro etched surface includes an additional micro etched portion whereupon is mounted the matrix configured collimating micro lens.

According to some embodiments of the present invention, the micro etched surface of the material includes a portion covered by a first metallic micro layer, and wherein surface of the first metallic micro layer includes a portion covered by a second metallic micro layer, such that the micro piezoelectric motor and the micro movable mirror are mounted upon a portion of the second metallic micro layer.

According to some embodiments of the present invention, the first metallic micro layer is a gold layer.

According to some embodiments of the present invention, the second metallic micro layer is a PZT (lead zirconate titanate) type material.

Some exemplary embodiments of the present invention are implemented by performing steps or procedures, and sub-steps or sub-procedures, in a manner selected from the group consisting of manually, semi-automatically, fully automatically, and a combination thereof, involving use and operation of system units, system sub-units, devices, assemblies, sub-assemblies, mechanisms, structures, components, and elements, and, peripheral equipment, utilities, accessories, and materials. Moreover, according to actual steps or procedures, sub-steps or sub-procedures, system units, system sub-units, devices, assemblies, sub-assemblies, mechanisms, structures, components, and elements, and, peripheral equipment, utilities, accessories, and materials, used for implementing a particular exemplary embodiment of the disclosed invention, the steps or procedures, and sub-steps or sub-procedures, are performed by using hardware, software, or/and an integrated combination thereof, and the system units, sub-units, devices, assemblies, sub-assemblies, mechanisms, structures, components, and elements, and, peripheral equipment, utilities, accessories, and materials, operate by using hardware, software, or/and an integrated combination thereof.

For example, software used, via an operating system, for implementing some exemplary embodiments of the present invention can include operatively interfaced, integrated, connected, or/and functioning written or/and printed data, in the form of software programs, software routines, software sub-routines, software symbolic languages, software code, software instructions or protocols, software algorithms, or a combination thereof. For example, hardware used for implementing some exemplary embodiments of the present invention can include operatively interfaced, integrated, connected, or/and functioning electrical, electronic or/and electromechanical system units, sub-units, devices, assemblies, sub-assemblies, mechanisms, structures, components, and elements, and, peripheral equipment, utilities, accessories, and materials, which may include one or more computer chips, integrated circuits, electronic circuits, electronic sub-circuits, hard-wired electrical circuits, or a combination thereof, involving digital or/and analog operations. Some exemplary embodiments of the present invention can be implemented by using an integrated combination of the just described exemplary software and hardware.

In some exemplary embodiments of the present invention, steps or procedures, and sub-steps or sub-procedures, can be performed by a data processor, such as a computing platform, for executing a plurality of instructions. Optionally, the data processor includes volatile memory for storing instructions or/and data, or/and includes non-volatile storage, for example, a magnetic hard-disk or/and removable media, for storing instructions or/and data. Optionally, some exemplary embodiments of the present invention include a network connection. Optionally, some exemplary embodiments of the present invention include a display device and a user input device, such as a keyboard or/and 'mouse'.

BRIEF DESCRIPTION OF THE SEVERAL VIEWS OF THE DRAWINGS

Exemplary embodiments of the present invention are herein described, by way of example only, with reference to the accompanying drawings. With specific reference now to the drawings in detail, it is stressed that the particulars shown are by way of example and for purposes of illustrative description of some embodiments of the present invention. In this regard, the description taken together with the accompanying drawings make apparent to those skilled in the art how exemplary embodiments of the present invention may be practiced.

In the drawings.

DESCRIPTION OF SPECIFIC EMBODIMENTS OF THE INVENTION

Figure 1:
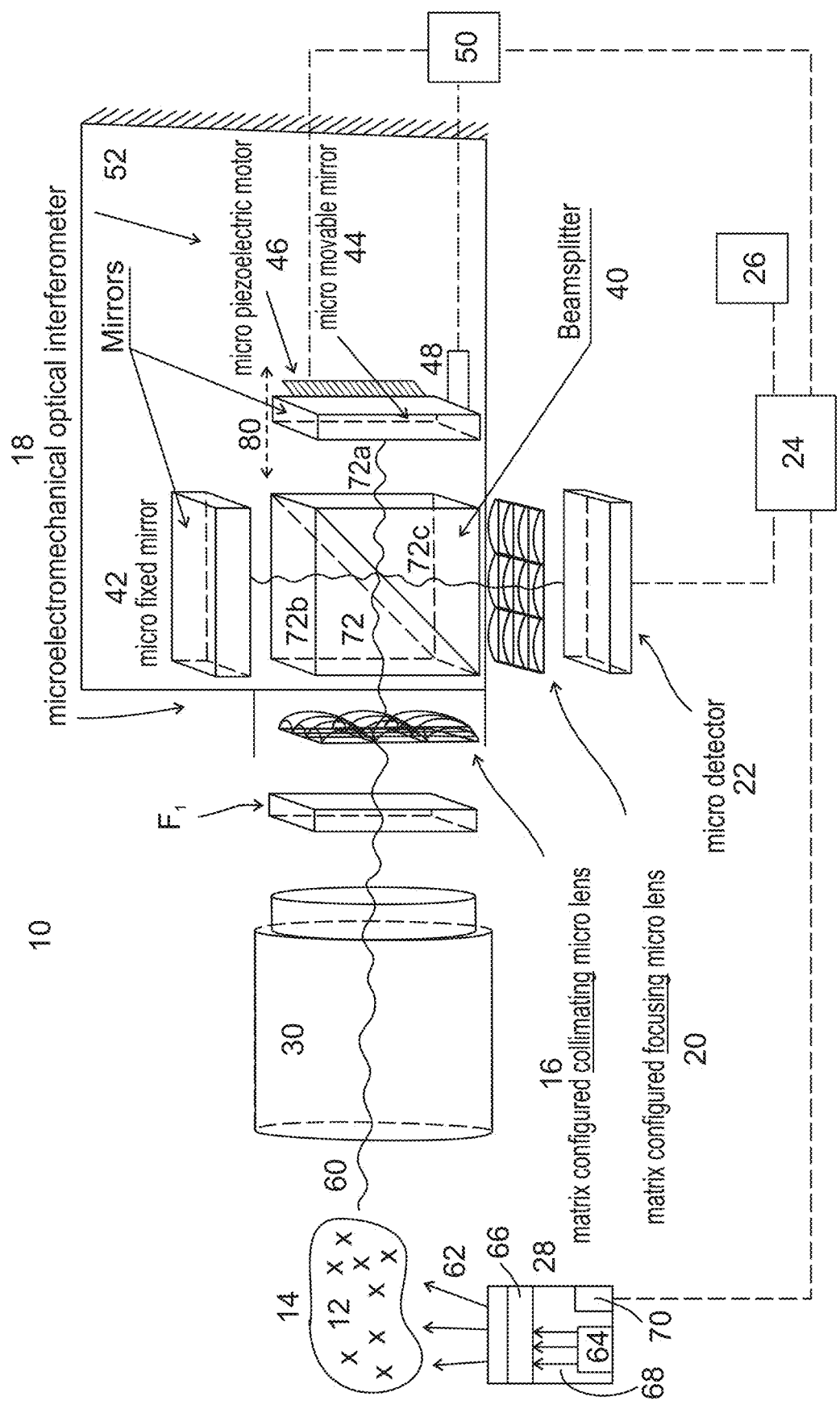
FIG. 1 is a schematic diagram illustrating an exemplary embodiment of the microelectromechanical system (MEMS) 10, and components thereof, for hyper-spectral imaging and analysis, highlighting an exemplary embodiment of the microelectromechanical (MEM) optical interferometer 18, and main components thereof, for hyper-spectral imaging and analysis, in accordance with the present invention.

The present invention, in some embodiments thereof, relates to the fields of hyper-spectral imaging and analysis, and microelectromechanical systems (MEMS) and microelectromechanical (MEM) components thereof, and more particularly, but not exclusively, to a microelectromechanical system (MEMS) for hyper-spectral imaging and analysis, and a microelectromechanical (MEM) optical interferometer for hyper-spectral imaging and analysis for hyper-spectral imaging and analysis.

Exemplary embodiments of the present invention are generally applicable for on-line (e.g., real time or near-real time) or off-line hyper-spectral imaging and analyzing, on a miniaturized or 'micro' (sub-centimeter [1 cm (10 mm) or less], or sub-millimeter) scale, essentially any type or kind of biological, physical, or/and chemical, (i.e., biophysicochemical) object (entity, material, substance, or structure), wherein the object is composed or made up of essentially any type, kind, and number of species or components, which in turn, are made up of essentially any type, kind, and number of organic or/and inorganic materials or substances. Some exemplary embodiments of the present invention are particularly applicable for hyper-spectral imaging and analyzing objects that are included in food products (and raw materials thereof), in agricultural products (e.g., plant matter, in raw or processed (finished) form), in environmental matter (e.g., contaminated air (aerosol), water, or ground), or in pharmaceutical products (and raw materials thereof). Exemplary embodiments of the present invention are generally applicable to essentially any field or area of technology which requires, or/and involves, hyper-spectrally imaging and analyzing objects on a miniaturized or micro (sub-centimeter, or sub-millimeter) scale.

Embodiments of the present invention include several special technical features, and aspects of novelty and inventiveness, for addressing and overcoming at least some limitations of current teachings of hyper-spectral imaging and analysis objects, particularly, as applied to a miniaturized or micro (sub-centimeter, or sub-millimeter) scale.

As stated hereinabove in the Background section, exemplary embodiments of a system, method, and optical interferometer, for real time high speed high resolution hyper-spectral imaging are illustratively described in same applicant/assignee U.S. Pat. No. 7,411,682 (reference 3). Such exemplary embodiments are well suited for high speed high resolution hyper-spectral imaging and analysis of objects on a 'macro' (centimeter or larger) scale. However, such exemplary embodiments are limited in applications requiring or/and involving high speed high resolution hyper-spectral imaging and analyzing on a miniaturized or 'micro' (sub-centimeter, or sub-millimeter) scale. Main limitations relate to size and dimensional aspects of the various electromechanical or/and optical design, structural, and functional (operational), characteristics, properties, and features, of the optical interferometer as part of the overall hyper-spectral imaging and analysis system.

Special technical features of exemplary embodiments of the present invention relate to addressing and overcoming at least some of these limitations, particularly, with respect to size and dimensional aspects of the various electromechanical or/and optical design, structural, and functional (operational), characteristics, properties, and features, of the microelectromechanical optical interferometer as part of exemplary embodiments of the overall microelectromechanical system (MEMS) for hyper-spectral imaging and analysis.

Selected special technical features, characteristics, and aspects of exemplary embodiments of the present invention are as follows:

High accuracy for >1 mm, and high speed (less than 0.5 sec/scan), down to 2 nm for applications involving visible (VIS) light, and 8 nm-20 nm for applications involving infra-red (IR) light.

Miniature size micro-lens-matrix, collimators, and filter optics, down to 3 mm matrix area.

Miniature size enclosure mechanics of the microelectromechanical optical interferometer by a factor of 2500 compared to current sizes.

Mechanical stabilization with high speed scanning & image grabbing, for enhancing hyper spectral imaging:
Reduction of mechanical noise by at least 6 dB.
Reduction of dark-noise by at least 3 dB (compact and closed units).
Enhancement of signal path transparencies by high optical matching.

Application of MEMS fabrication techniques for manufacturing/configuring a portion of the microelectromechanical optical interferometer, wherein a linear piezoelectric actuator motor is capable of displacements of on the order of one millimeter (1 mm), while having an area footprint of five times (5×) smaller than existing sizes.

It is to be understood that the present invention is not limited in its application to the details of type, composition, construction, arrangement, order, and number, of system units, system sub-units, devices, assemblies, sub-assemblies, mechanisms, structures, components, elements, and configurations, and, peripheral equipment, utilities, accessories, and materials, of exemplary embodiments of the system or/and device, or to the details of the order or sequence, number, of steps or procedures, and sub-steps or sub-procedures, of operation of exemplary embodiments of the microelectromechanical systems (MEMS) for hyper-spectral imaging and analysis, or/and of the microelectromechanical (MEM) optical interferometer for hyper-spectral imaging and analysis, set forth in the following illustrative description, and accompanying drawings, unless otherwise specifically stated herein. Accordingly, the present invention can be practiced or implemented according to various other alternative exemplary embodiments and in various other exemplary alternative ways.

It is also to be understood that all technical and scientific words, terms, or/and phrases, used herein throughout the present disclosure have either the identical or similar meaning as commonly understood by one of ordinary skill in the art to which this invention belongs, unless otherwise specifically defined or stated herein. Phraseology, terminology, and, notation, employed herein throughout the present disclosure are for the purpose of description and should not be regarded as limiting.

Moreover, all technical and scientific words, terms, or/and phrases, introduced, defined, described, or/and exemplified, in the above Field and Background sections, are equally or similarly applicable in the illustrative description of the embodiments, examples, and appended claims, of the present invention. Immediately following are selected definitions and exemplary usages of words, terms, or/and phrases, which are used throughout the illustrative description of some embodiments, examples, and appended claims, of the present invention, and are especially relevant for understanding thereof.

Each of the following terms written in singular grammatical form: 'a', 'an', and 'the', as used herein, may also refer to, and encompass, a plurality of the stated entity or object, unless otherwise specifically defined or stated herein, or, unless the context clearly dictates otherwise. For example, the phrases: 'a unit', 'a device', 'an assembly', 'a mechanism', 'a component', and 'an element', as used herein, may also refer to, and encompass, a plurality of units, a plurality of devices, a plurality of assemblies, a plurality of mechanisms, a plurality of components, and a plurality of elements, respectively.

Each of the following terms: 'includes', 'including', 'has', 'having', 'comprises', and 'comprising', and, their linguistic/grammatical variants, derivatives, or/and conjugates, as used herein, means 'including, but not limited to'.

The phrase 'operatively connected', as used herein, equivalently refers to the corresponding synonymous phrases 'operatively joined', and 'operatively attached', where the operative connection, operative joint, or operative attachment, is according to a physical, or/and electrical, or/and electronic, or/and mechanical, or/and electro-mechanical, manner or nature, involving various types and kinds of hardware or/and software equipment and components.

The term 'real-time', as used herein, generally refers to essentially any action, activity, step, procedure, process, or operation, which is (automatically or/and manually) performed or implemented at the same time, or at nearly the same time, with negligible or insignificant time lag, that the targeted (monitored, tracked, observed) event or situation of interest occurs or takes place.

Accordingly, the phrase 'real-time hyper-spectral imaging and analysis', as used herein, generally refers to the various actions, activities, steps, procedures, processes, or operations, of hyper-spectrally imaging and analyzing an object (and components thereof) (for example, included in a scene or sample of matter), which are (automatically or/and manually) performed or implemented (by any number of human or/and machine type operators or/and controllers) at the same time, or at nearly the same time, with negligible or insignificant time lag, that the targeted (monitored, tracked, observed) event or situation of interest occurs or takes place.

The term 'about', as used herein, refers to ±10% of the stated numerical value.

Throughout the illustrative description of some embodiments, the examples, and the appended claims, of the present invention, a numerical value of a parameter, feature, object, or dimension, may be stated or described in terms of a numerical range format. It is to be fully understood that the stated numerical range format is provided for illustrating implementation of some embodiments of the present invention, and is not to be understood or construed as inflexibly limiting the scope of embodiments of the present invention.

Accordingly, a stated or described numerical range also refers to, and encompasses, all possible sub-ranges and individual numerical values (where a numerical value may be expressed as a whole, integral, or fractional number) within that stated or described numerical range. For example, a stated or described numerical range 'from 1 to 6' also refers to, and encompasses, all possible sub-ranges, such as 'from 1 to 3', 'from 1 to 4', 'from 1 to 5', 'from 2 to 4', 'from 2 to 6', 'from 3 to 6', etc., and individual numerical values, such as '1', '1.3', '2', '2.8', '3', '3.5', '4', '4.6', '5', '5.2', and '6', within the stated or described numerical range of 'from 1 to 6'. This applies regardless of the numerical breadth, extent, or size, of the stated or described numerical range.

Moreover, for stating or describing a numerical range, the phrase 'in a range of between about a first numerical value and about a second numerical value', is considered equivalent to, and meaning the same as, the phrase 'in a range of from about a first numerical value to about a second numerical value', and, thus, the two equivalently meaning phrases may be used interchangeably.

A main aspect of some embodiments of the present invention is provision of a microelectromechanical system (MEMS) for hyper-spectral imaging and analysis, including the following main components: (a) a matrix configured collimating micro lens, (b) a microelectromechanical (MEM) optical interferometer, (c) a matrix configured focusing micro lens, (d) a micro detector, and (e) a micro central programming and control/data/information signal processing unit (micro-CPPU).

With reference to the drawings, FIG. 1 is a schematic diagram illustrating an exemplary embodiment of the microelectromechanical system (MEMS) 10, and components thereof, for hyper-spectral imaging and analysis, highlighting an exemplary embodiment of the microelectromechanical (MEM) optical interferometer 18, and main components thereof, for hyper-spectral imaging and analysis.

The exemplary embodiment of the microelectromechanical system (MEMS) 10, and components thereof, for hyper-spectral imaging and analysis, herein, for brevity, also referred to as hyper-spectral imaging and analysis system 10, is implemented for real time high speed high resolution generating, collecting, processing, and analyzing, hyper-spectral images of one or more objects, herein, generally referred to as object or objects 12, in a scene or sample 14. Each object 12 either inherently emits electromagnetic radiation in the form of an emission spectrum, or is affected in a way, such as excitation by incident electromagnetic radiation, supplied by an external source of the electromagnetic radiation, causing each object 12 to emit electromagnetic radiation in the form of an emission spectrum.

The exemplary embodiment of the microelectromechanical system (MEMS) 10 for hyper-spectral imaging and analysis, of the present invention, includes the following main components: (a) a matrix configured collimating micro lens 16, (b) a microelectromechanical (MEM) optical interferometer 18, (c) a matrix configured focusing micro lens 20, (d) a micro detector 22, and (e) a micro central programming and control/data/information signal processing unit (micro-CPPU) 24.

Hyper-spectral imaging and analysis system 10, optionally, further includes: (f) a display device 26, (g) an object or sample illumination mechanism 28, (h) at least one electromagnetic radiation filter, such as electromagnetic radiation filter Fi, and (i) a source objective lens 30. Electrical and/or electronic communications between selected components of hyper-spectral imaging and analysis system 10 and micro central programming and control/data/information signal processing unit (micro-CPPU) 24 are indicated in FIG. 1 by control/data links, shown as dashed lines connecting the selected components with micro-CPPU 24.

By way of the microelectromechanical (MEM) optical interferometer 18 being a main component of the microelectromechanical system (MEMS) for hyper-spectral imaging and analysis 10, the present invention, in some embodiments, also features a device, corresponding to the microelectromechanical (MEM) optical interferometer 18, for hyper-spectral imaging and analysis. Accordingly, again with reference to FIG. 1, another main aspect of some embodiments of the present invention is provision of a microelectromechanical (MEM) optical interferometer for hyper-spectral imaging and analysis, including the following main components: (a) a micro beam splitter, (b) a micro fixed mirror, (c) a micro movable mirror, (d) a micro piezoelectric motor, (e) a micro distance change feedback sensor, (f) a micro piezoelectric motor controller, and (g) a micro optical interferometer mount.

As shown in FIG. 1, the exemplary embodiment of microelectromechanical (MEM) optical interferometer 18 for hyper-spectral imaging and analysis, includes the following main components: (a) a micro beam splitter 40, (b) a micro fixed mirror 42, (c) a micro movable mirror 44, (d) a micro piezoelectric motor 46, (e) a micro distance change feedback sensor 48, (f) a micro piezoelectric motor controller 50, and (g) a micro optical interferometer mount 52.

In some embodiments of the present invention, matrix configured collimating micro lens 16 is configured and operatively positioned for being part of, and included in, microelectromechanical (MEM) optical interferometer 18. According to such embodiments, micro optical interferometer mount 52 is additionally configured and suitable as a mount of matrix configured collimating micro lens 16.

As illustrated in FIG. 1, objects 12 in scene or sample 14, emit electromagnetic radiation in the form of an object emission beam 60, characterized by an emission spectrum. For example, objects 12 in scene or sample 14 inherently emit electromagnetic radiation, in the form of object emission beam 60, as a result of inherent (body) thermal heat emitted by objects 12. Alternatively, objects 12 in scene or sample 14 emit electromagnetic radiation as a result of excitation by incident electromagnetic radiation 62, for example, visible light, ultraviolet light, or infrared light, supplied by an external source, for example, optional object or sample illumination mechanism 28 which radiates electromagnetic radiation 62, upon objects 12, causing objects 12 to emit electromagnetic radiation in the form of object emission beam 60.

Optional object or sample illumination mechanism 28 includes, for example, (i) a light source 64, (ii) a light collimating element 66, such as a collimating lens for collimating light 68 exiting light source 64 in the direction of objects 12 in scene or sample 14, (iii) a local illumination mechanism control unit 70 in electronic communication with micro central programming and control/data/information signal processing unit (micro-CPPU) 24, and appropriate control/data links. In some embodiments, for example, light source 64 generates light 68 having a complete spectrum. In some embodiments, for example, electromagnetic radiation 62 exiting object or sample illumination mechanism 28 passes through at least one expansion lens (not shown) functioning to expand the beam of exiting electromagnetic radiation 62.

Electromagnetic radiation 62, in the form of light, supplied by object or sample illumination mechanism 28, for illuminating objects 12 in scene or sample 14, is selected from the group consisting of polychromatic light, monochromatic light, poly- or multi-monochromatic light, and combinations thereof. An exemplary polychromatic light is white light. An exemplary monochromatic light is selected from the group consisting of visible spectrum monochromatic light, such as red light, blue light, or green light, and, invisible spectrum monochromatic light, such as ultra-violet light or infrared light. An exemplary poly- or multi-chromatic light is a combination of a plurality of at least two different previously listed exemplary monochromatic lights. Object or sample illumination mechanism 28 is controlled by a local illumination mechanism control unit 70 in electronic communication with micro central programming and control/data/information signal processing unit (micro-CPPU) 24.

In some embodiments, object emission beam 60 passes through optional source objective lens 30, and is then collimated by matrix configured collimating micro lens 16, for forming collimated object emission beam 72. In some embodiments (as shown in FIG. 1), optionally, an electromagnetic radiation filter, for example, Fi, is located on the incoming or receiving side of matrix configured collimating micro lens 16. In alternative embodiments, optionally, an electromagnetic radiation filter, for example, Fi, is located on the outgoing or exiting side of matrix configured collimating micro lens 16.

Microelectromechanical (MEM) optical interferometer 18 receives collimated object emission beam 72. Microelectromechanical optical interferometer 18 operates as a type of optical interferometer which generates interference patterns or images, and is selected from the group consisting of a microelectromechanical scanning optical path difference (OPD) generator, a microelectromechanical Fourier transform spectrometer, and, a microelectromechanical Michelson interferometer, each having a micro movable mirror, such as micro movable mirror 44.

In hyper-spectral imaging and analysis system 10, microelectromechanical (MEM) optical interferometer 18 is configured, for example, such that micro fixed mirror 42 and micro movable mirror 44 are located at a right angle to each other, and each mirror is oriented at a pre-determined angle, for example, a 45° angle, relative to the beam splitting surface of cubic micro beam splitter 40 positioned at the vertex of the right angle between the two mirrors. The reflective surface of micro fixed mirror 42 and of micro movable mirror 44 is, for example, flat and smooth.

In some embodiments, micro beam splitter 40 and micro fixed mirror 42 are configured on micro optical interferometer mount 52 in a manner whereby there is a separation distance (via an air gap or space) between micro beam splitter 40 and micro fixed mirror 42, such that these two components do not contact each other during operation of microelectromechanical (MEM) optical interferometer 18.

In some embodiments, micro beam splitter 40 and micro movable mirror 44 are configured on micro optical interferometer mount 52 in a manner whereby there is a separation distance (via air) between micro beam splitter 40 and micro movable mirror 44, such that these two components do not contact each other during operation of microelectromechanical (MEM) optical interferometer 18.

Collimated object emission beam 72 incident on cubic micro beam splitter 40 is divided into two beams, beam 72*a* and beam 72*b*. Beam 72*a* corresponds to collimated object emission beam 72 which passes through cubic micro beam splitter 40 and onto micro movable mirror 44, while beam 72*b* corresponds to collimated object emission beam 72 which reflects off cubic beam splitter 40 and onto micro fixed mirror 42. Beam 72*a* reflects off micro movable mirror 44, onto and off cubic micro beam splitter 40, forming a first part of exiting beam 72*c*. Beam 72*b* reflects off cubic micro beam splitter 40, onto and off micro fixed mirror 42, and then passes through cubic micro beam splitter 40, forming a second part of exiting beam 72*c*. First and second parts of exiting beam 72*c* together exit out of microelectromechanical (MEM) optical interferometer 18, pass through matrix configured focusing micro lens 20, and enter (and detected by) micro detector 22.

The incident and reflective surface of micro movable mirror 44 is, for example, perpendicular to (a virtual or optical) axis 80 which is parallel to the optical path along which collimated object emission beam 72 and beam 72*a* travel. For each location or position of the incident or reflective surface of micro movable mirror 44 along axis 80, parallel to collimated object emission beam 72 and beam 72*a*, an interference pattern or image is generated as the two phase-shifted exiting beams, namely, first and second parts of exiting beam 72*c* interfere with each other.

Each generated interference pattern or image is focused by a matrix configured focusing micro lens 20, and is recorded/detected by micro detector 22. A plurality of recorded interference images are processed by an image processing unit, such as micro central programming and control/data/information signal processing unit (micro-CPPU) 24, for forming an interferogram. A plurality of interferograms are then processed by micro central programming and control/data/information signal processing unit (micro-CPPD) 24, for forming a three-dimensional hyper-spectral (cube) image. Three-dimensional hyper-spectral (cube) images are subjected to a variety of different analysis and processing procedures, for example, involving pattern recognition and classification analysis, for extracting and classifying meaningful information and data which can be used for a particular application.

Implementation and operation of hyper-spectral imaging and analysis system 10, via operation of microelectromechanical (MEM) optical interferometer 18, further includes piezoelectrically determining and changing the magnitude of the optical path difference (OPD) of the divided collimated object emission beam 72, for generating at least one interference image for each magnitude of the optical path difference (OPD).

The magnitude of the optical path difference (OPD) of the divided collimated object emission beam 72 is defined as, and determined by, the difference in the lengths of the optical paths traveled by the divided beams, first and second parts of exiting beam 72*c*, which together exit out of microelectromechanical (MEM) optical interferometer 18, pass through matrix configured focusing micro lens 20, and enter (and detected by) micro detector 22. The magnitude of the optical path difference (OPD) of the divided collimated object emission beam 72 is piezoelectrically determined and changed according to the position or location and positioning of incident and reflective surface of micro movable mirror 44 along (virtual or optical) axis 80. Accordingly, the magnitude of the optical path difference (OPD) of the divided collimated object emission beam 72 is piezoelectrically changed by piezoelectrically changing the location or position of the reflective surface of micro movable mirror 44 along axis 80, which is done by piezoelectrically controlling movement of micro movable mirror 44 along axis 80.

The magnitude of the optical path difference (OPD), and the change in the magnitude of the optical path difference (OPD) of the divided collimated object emission beam 72, are each a function of the type of the electromagnetic radiation of object emission beam 60 emitted by objects 12 in scene or sample 14. In some embodiments, the typical 'maximum' magnitude of the optical path difference (OPD) of the divided collimated object emission beam 72 is on the order of 10 wavelengths, for obtaining high resolution hyper-spectral images. This is in strong contrast to prior art techniques of using an optical interferometer for hyper-spectral imaging, whereby a typical maximum magnitude of the optical path difference (OPD) on the order of 40 wavelengths is required for obtaining high resolution hyper-spectral images. The smaller maximum magnitude of the optical path difference (OPD) required by embodiments of the present invention is advantageous over prior art due to the fact that decreasing the magnitude of the optical path difference (OPD) increases positioning accuracy and scanning rate of micro movable mirror 44 in microelectromechanical (MEM) optical interferometer 18.

In microelectromechanical (MEM) optical interferometer 18, micro piezoelectric motor 46 is operatively connected to micro movable mirror 24 and operatively connected, via control/data links, to micro piezoelectric motor controller 50, and functions by highly accurately and highly reproducibly displacing or moving micro movable mirror 44 along (virtual or optical) axis 80. The extent of piezoelectrically changing the magnitude of the optical path difference (OPD) of the divided collimated object emission beam 72 along axis 80, is in the range of from about zero wavelengths to about ten wavelengths.

Micro distance change feedback sensor 48 is operatively connected to micro movable mirror 44 and operatively connected, via control/data links, to micro piezoelectric motor controller 50, and functions by highly accurately and highly reproducibly sensing and measuring the change in distance or position of micro movable mirror 44 along axis 80. In general, distance change feedback sensor 48 is any appropriate accurate and reproducible distance or position change sensor, for sensing and measuring the change in distance or position of micro movable mirror 44 along axis 80. In some embodiments, for example, micro distance change feedback sensor 48 is a capacitor sensor. A capacitor sensor is capable of highly accurately and highly reproducibly sensing and measuring changes in distance or position of a relatively small object, such as micro movable mirror 44, with nanometer resolution. As a result, the operative combination of micro piezoelectric motor 46 and micro distance change feedback sensor 48 in the form of a capacitor sensor enables micro piezoelectric motor 46 to highly accurately and highly reproducibly move micro movable mirror 44 with nanometer resolution, which is required for image processing of the obtained interferograms.

Micro distance change feedback sensor 48, in the form of a capacitor sensor, is a capacitor having two plates, and is configured in such a way that the first plate of the capacitor is connected to micro movable mirror 44, and the second plate of the capacitor is connected to micro optical interferometer mount 52 of microelectromechanical (MEM) optical interferometer 18. When the distance or position of micro movable mirror 44 along axis 80 changes, via actuation and operation of micro piezoelectric motor 46, the distance between the two plates of the capacitor of micro distance change feedback sensor 48 changes, causing a change in capacity concurrent with a change in the potential difference existing between the two capacitor plates. The potential difference existing between the two capacitor plates of micro distance change feedback sensor 48 is measured by micro piezoelectric motor controller 50.

Micro piezoelectric motor controller 50 is operatively connected, via control/data links, to micro piezoelectric motor 46, and operatively connected, via control/data links, to micro distance change feedback sensor 48, and operatively connected, via control/data links, to micro central programming and control/data/information signal processing unit (micro-CPPU) 24. Micro piezoelectric motor controller 50 functions by highly accurately and highly reproducibly actuating and controlling micro piezoelectric motor 46, according to previously described measurement of the potential difference existing between the two capacitor plates of micro distance change feedback sensor 48, and according to the required change in distance or position of micro movable mirror 44 along axis 80 received, via the control/data links, by micro piezoelectric motor controller 50 in the form of a command sent by micro central programming and control/data/information signal processing unit (micro-CPPU) 24.

In some embodiments, micro piezoelectric motor controller 50 operates as a closed loop controller of the change in distance or position of micro movable mirror 44 along axis 80. The relationship between the measurement of the potential difference existing between the two capacitor plates of micro distance change feedback sensor 48 and the optical path difference (OPD) of the divided collimated object emission beam 72, for actuating a required change in distance or position of micro movable mirror 44 along axis 80, is used for implementing the present invention. A calibration procedure is used for measuring and generating calibration values of this relationship, which are stored, for example, in a data/information look up table, for example, in micro central programming and control/data/information signal processing unit (micro-CPPU) 24.

Micro piezoelectric motor controller 50 measures the potential difference existing between the two capacitor plates of micro distance change feedback sensor 48, by measuring the distance between the two capacitor plates of micro distance change feedback sensor 48, by applying AC voltage or current, depending on a particular implementation. For example, micro piezoelectric motor controller 50 measures the distance between the two capacitor plates of micro distance change feedback sensor 48 by applying AC voltage generated by a highly stable sinusoidal signal generator stabilized by an amplitude stabilizer, and measuring the potential difference and the frequency emerging from the capacitor, which is a function of the distance between the two capacitor plates of the capacitor sensor.

In some embodiments, implementation and operation of hyper-spectral imaging and analysis system 10 further includes performing a calibration procedure for calibrating changes in the magnitude of the optical path difference (OPD) of the divided collimated object emission beam 72, and therefore, calibrating the magnitude of the optical path difference (OPD) of the divided collimated object emission beam 72.

Accordingly, there is measuring changes in the magnitude of the optical path difference (OPD), as a function of potential difference existing between the two capacitor plates measured by micro distance change feedback sensor 48, and storing the measured values in the piezo-look-up-table (PLUT). Generating calibration values which are stored in the piezo-look-up-table (PLUT) is done by performing different alternative calibration procedures.

In an exemplary calibration procedure, calibration values stored in the piezo-look-up-table (PLUT) are generated by illuminating matrix configured collimating micro lens 16 using a laser beam, and determining the magnitude of the optical path difference (OPD) by analyzing the diffraction pattern formed on the surface of micro detector 22. Performing such an exemplary calibration procedure includes obtaining a plurality of interference images, using microelectromechanical (MEM) optical interferometer 18, as described above, for each change in the magnitude of the optical path difference (OPD) of the divided collimated object emission beam 72, for the purpose of reducing measurement noise and improving measurement accuracy and interference image resolution. In some embodiments, there is obtaining a plurality of at least twenty, and up to about five-hundred, interference images for each change in the magnitude of the optical path difference (OPD).

Thus, for performing the real time high speed high resolution hyper-spectral imaging of objects 12 in scene or sample 14, a plurality of interference images are generated, for each magnitude of the optical path difference (OPD) of the divided collimated object emission beam 72 piezoelectrically determined and changed, as described above, by micro central programming and control/data/information signal processing unit (micro-CPPU) 24 sending, via the control/data links, a command, including data and information of the generated calibration values of the magnitude of the optical path difference (OPD) stored in the piezo-look-up-table (PLUT), to micro piezoelectric motor controller 50, for highly accurately and highly reproducibly actuating and controlling micro piezoelectric motor 46, for highly accurately and highly reproducibly displacing or moving micro movable mirror 44 along axis 80 of microelectromechanical (MEM) optical interferometer 18.

Implementation and operation of hyper-spectral imaging and analysis system 10 further includes focusing and recording (detecting) each generated interference image associated with a corresponding magnitude of optical path difference (OPD) of the divided collimated object emission beam, for forming a plurality of recorded interference images.

Each interference image associated with a corresponding magnitude of optical path difference (OPD) of the divided collimated object emission beam 72 is focused by matrix configured focusing micro lens 20 onto micro detector 22, for forming a plurality of recorded interference images.

Micro detector 22 is operatively connected, via control/data links, to micro central programming and control/data/information signal processing unit (micro-CPPU) 24, and functions by highly accurately and highly reproducibly recording the generated interference images focused by matrix configured focusing micro lens 20.

In some embodiments, micro detector 22 is either a one-dimensional pixels array detector, or preferably, a two-dimensional pixels matrix detector. For example, for visible (VIS) or near infra-red (IR) light, micro detector 22 is preferably a two-dimensional charge coupled device (CCD) matrix photo-detector, featuring high detection quantum efficiency, a high spatial resolution (small pixel size) and high sensitivity in a wide range of spectral regions (visible region to near infra-red (IR) region). The spectral region sensitivity of micro detector 22 encompasses at least a part of the spectral range of electromagnetic radiation of object emission beam 60 emitted by objects 12 in scene or sample 14. Micro detector 22 simultaneously captures a large volume of spectral data and information exiting beam 72c, and rapidly transfers the captured spectral data and information to micro central programming and control/data/information signal processing unit (micro-CPPU) 24, therefore enabling real time high speed high spatial and spectral resolution spectral imaging. In some embodiments, this procedure includes storing the plurality of recorded interference images in an appropriate database, via micro-CPPU 24, for use in processing, analyzing, and displaying, the recorded interference images.

In some embodiments, optionally, an electromagnetic radiation filter, for additionally focusing electromagnetic radiation within a particular spectral region of interest, of first and second parts of exiting beam 72c together exiting microelectromechanical (MEM) optical interferometer 18 and entering micro detector 22, is placed before matrix configured focusing micro lens 20. For example, there is using a 400 nanometer cutoff radiation filter as electromagnetic radiation filter, for additionally focusing electromagnetic radiation within a particular spectral region of interest, of first and second parts of exiting beam 72c together exiting out of microelectromechanical (MEM) optical interferometer 18, passing through matrix configured focusing micro lens 20, and entering (and detected by) micro detector 22.

Implementation and operation of hyper-spectral imaging and analysis system 10 further includes analyzing a plurality of the synthesized hyper-spectral (cube) images. This includes analyzing a plurality of synthesized hyper-spectral (cube) images by applying one or more image analysis algorithms, via micro central programming and control/data/information signal processing unit (micro-CPPU) 24.

In some embodiments, for example, there is analyzing the synthesized plurality of hyper-spectral (cube) images by applying pattern recognition and classification types of image analysis algorithms. Specific types of image analysis algorithms used for analyzing the synthesized plurality of hyper-spectral (cube) images are selected according to the specific application of the present invention. As stated hereinabove, exemplary embodiments of the present invention are generally applicable to essentially any field or area of technology which requires, or/and involves, hyper-spectrally imaging and analyzing objects on a miniaturized or micro (sub-centimeter, or sub-millimeter) scale. For example, in applications where there is need or interest for real time high speed high resolution hyper-spectral imaging of objects in a scene or sample, such as objects 12 in scene or sample 14, which emit electromagnetic radiation in the form of an object emission beam 60 characterized by an emission spectrum, and analyzing the hyper-spectral (cube) images synthesized therefrom, for a main purpose of obtaining meaningful and useful data and information about the objects in the scene or sample.

Implementation and operation of hyper-spectral imaging and analysis system 10, optionally, further includes displaying any of the plurality of interference images, interferogram images, and/or hyper-spectral (cube) images, for example, via display device 26. In some embodiments, display device 26 is operatively connected, via control/data links, to micro central programming and control/data/information signal processing unit (micro-CPPU) 24, and functions by highly accurately and highly reproducibly displaying either singly or in combination any of the above indicated images and/or results of analyses thereof.

Some embodiments of the present invention include special technical features, characteristics, and aspects, which particularly relate to design, construction, configuration, and operation, of the microelectromechanical (MEM) optical interferometer, for example, microelectromechanical (MEM) optical interferometer 18, included in the microelectromechanical system (MEMS) for hyper-spectral imaging and analysis, for example, hyper-spectral imaging and analysis system 10 illustrated in FIG. 1.

For example, in some embodiments, micro optical interferometer mount 52 is made of a material including a micro etched surface. An exemplary material is selected from the group consisting of micro etchable semi-metallic materials, micro etchable non-metallic materials, and micro etchable metallic materials. An exemplary micro etchable semi-metallic material is selected from the group consisting of micro etchable silicon materials and micro etchable silicon-like materials.

In some embodiments, the micro etched surface of the micro etchable material includes one or more micro etched portions whereupon are mounted at least one of: the micro beam splitter 40, the micro fixed mirror 42, the micro movable mirror 44, the micro piezoelectric motor 46, and the micro distance change feedback sensor 48. In some embodiments, the micro etched surface of the micro etchable material includes one or more micro etched portions whereupon are mounted all of: the micro beam splitter 40, the micro fixed mirror 42, the micro movable mirror 44, the micro piezoelectric motor 46, and the micro distance change feedback sensor 48.

In some embodiments, wherein the matrix configured collimating micro lens 16 is configured and operatively positioned for being part of, and included in, the microelectromechanical optical interferometer 18, the micro etched surface includes an additional micro etched portion whereupon is mounted the matrix configured collimating micro lens 16.

For example, in some embodiments, the micro etched surface of the material includes a portion covered by a first metallic micro layer, and wherein surface of the first metallic micro layer includes a portion covered by a second metallic micro layer, such that the micro piezoelectric motor 46 and the micro movable mirror 44 are mounted upon a portion of the second metallic micro layer. An exemplary first metallic micro layer is a gold layer. An exemplary second metallic micro layer is a PZT (lead zirconate titanate) type material (for example, a PZT wafer).

Figure 2:
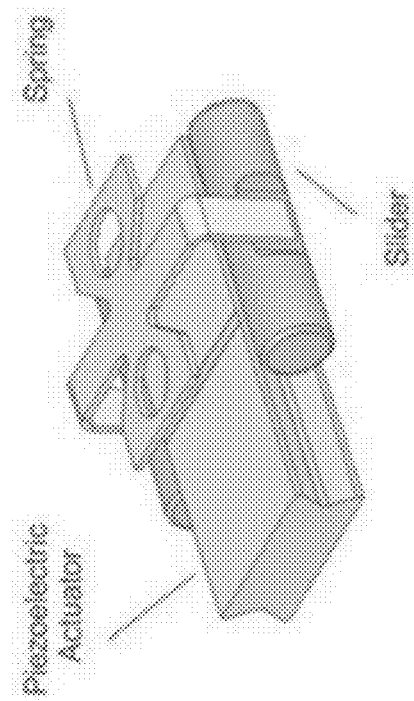
FIG. 2 is a pictorial diagram illustrating exemplary embodiments of linear piezoelectric actuator motors manufactured via a standard technique.
Figure 2:
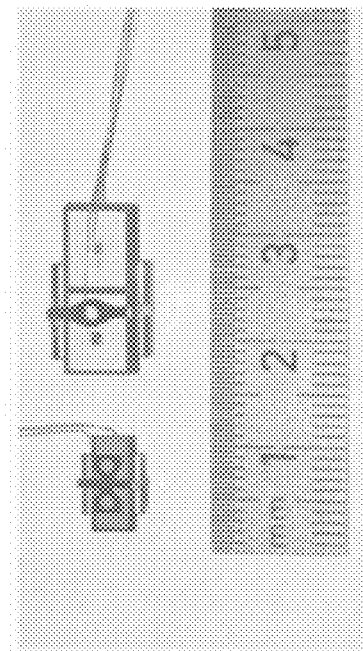

FIG. 2 is a pictorial diagram illustrating exemplary embodiments of known linear piezoelectric actuator motors manufactured via a standard technique.

Figure 3:
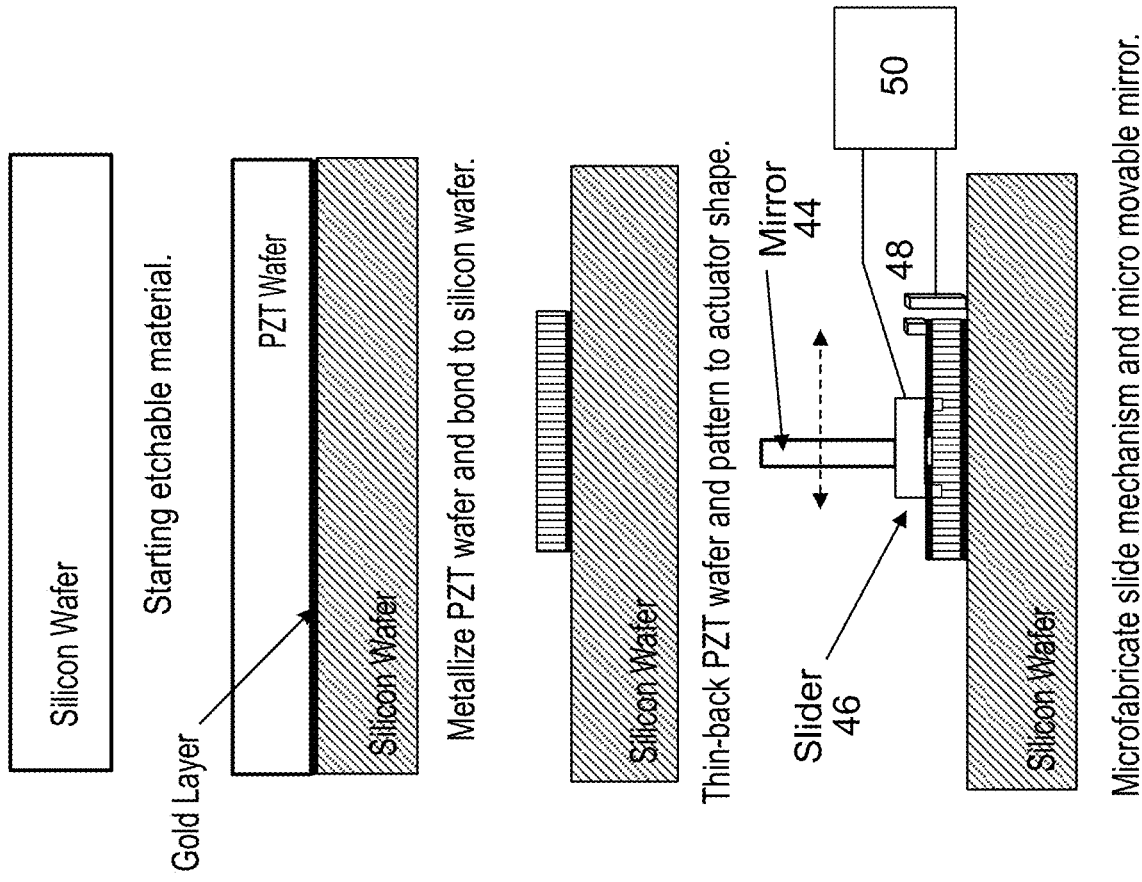
FIG. 3 is a schematic diagram illustrating an exemplary embodiment of selected steps/procedures of manufacturing/configuring exemplary embodiments of portions of the microelectromechanical (MEM) optical interferometer for hyper-spectral imaging and analysis, including positioning of some of the interferometer elements, using an exemplary microelectromechanical technique, in accordance with the present invention.

FIG. 3 is a schematic diagram illustrating an exemplary embodiment of selected steps/procedures of manufacturing/configuring exemplary embodiments of portions of the microelectromechanical (MEM) optical interferometer, for example, microelectromechanical optical interferometer 18, including positioning of some of the interferometer elements, for hyper-spectral imaging and analysis, using an exemplary microelectromechanical technique.

Such an exemplary embodiment includes the following main steps or procedures, and components and functionalities thereof:

(1) providing a micro-etchable material, such as a silicon wafer.
(2) providing a PZT (lead zirconate titanate) type material, such as a PZT wafer.
(3) coating a portion of a surface of the PZT type material with a metallic micro layer, for example, a gold micro layer, and leaving the opposite surface of the PZT type material uncoated.
(4) attaching or bonding the surface of the metallic micro layer coated upon the PZT type material to a micro etched or unetched portion of the surface of the micro mount material.
(5) patterning the portion of the uncoated opposite surface of the PZT type material according to the shape and form of a pre-designed micro piezoelectric motor, such as micro piezoelectric motor 46.
(6) configuring (positioning, connecting) and mounting the micro piezoelectric motor upon the patterned portion of the uncoated opposite surface of the PZT type material.
(7) configuring (positioning, connecting) and mounting a pre-designed micro movable mirror, such as micro movable mirror 44, upon the micro piezoelectric motor.

In some embodiments, the method further includes configuring (positioning, connecting) and mounting a matrix configured collimating micro lens, such as matrix configured collimating micro lens 16, upon a micro etched portion of the surface of the material, or/and upon an unetched portion of the surface of the material.

In some embodiments, the method further includes configuring (positioning, connecting) and mounting a pre-designed micro distance change feedback sensor, such as micro distance change feedback sensor 48, upon the micro mount material.

In some embodiments, the method further includes operatively positioning and connecting the micro piezoelectric motor and the micro distance change feedback sensor to a micro piezoelectric motor controller, such as micro piezoelectric motor controller 50.

Figure 4:
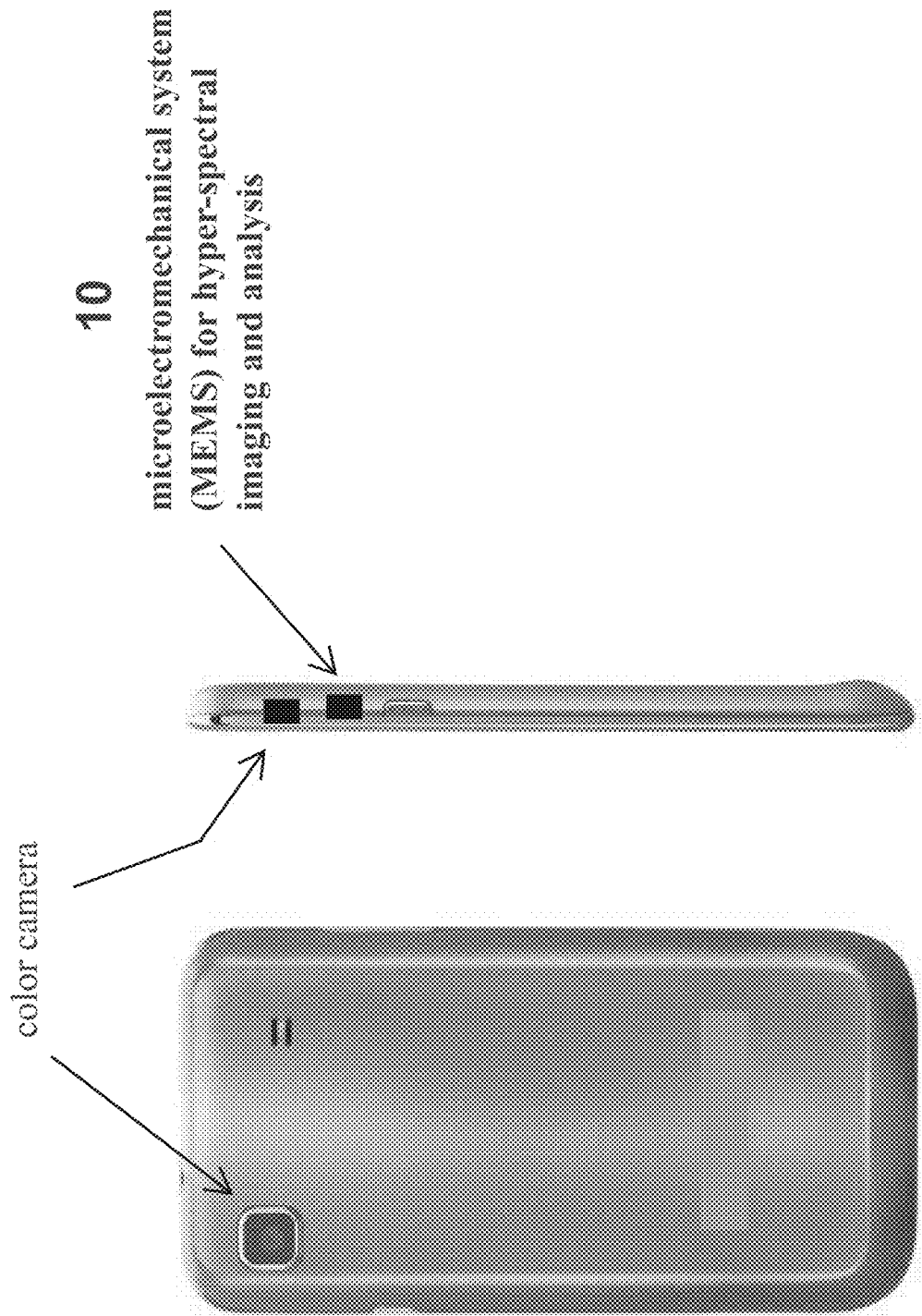
FIG. 4 is a pictorial diagram illustrating an exemplary embodiment of an exemplary application of the microelectromechanical system (MEMS) for hyper-spectral imaging and analysis, included as an additional part or component of a device housing a color camera, in accordance with the present invention.

FIG. 4 is a pictorial diagram illustrating an exemplary embodiment of an exemplary application of the microelectromechanical system (MEMS) for hyper-spectral imaging and analysis, for example, microelectromechanical system (MEMS) 10, included as an additional part or component of a device housing a color camera. This illustrates a commercial type application of some embodiments of the present invention.

The present invention, in some embodiments thereof, as illustratively described and exemplified hereinabove, includes several special technical features, and, aspects of novelty and inventiveness, for addressing and overcoming at least some limitations of current teachings of hyper-spectral imaging and analysis objects, as applied to a miniaturized or micro (sub-centimeter [1 cm (10 mm) or less], or sub-millimeter) scale.

Exemplary special technical features of some embodiments of the present invention relate to addressing and overcoming at least some of these limitations, particularly, with respect to size and dimensional aspects of the various electromechanical or/and optical design, structural, and functional (operational), characteristics, properties, and features, of the microelectromechanical optical interferometer as part of exemplary embodiments of the overall microelectromechanical system (MEMS) for hyper-spectral imaging and analysis.

Embodiments of the present invention are readily commercially applicable to a wide variety of different industries. Exemplary embodiments of the present invention are generally commercially applicable for on-line (e.g., real time or near-real time) or off-line hyper-spectral imaging and analyzing, on a miniaturized or 'micro' (sub-centimeter, or sub-millimeter) scale, essentially any types or kinds of biological, physical, or/and chemical, (i.e., biophysicochemical) objects.

It is to be fully understood that certain aspects, characteristics, and features, of the present invention, which are illustratively described and presented in the context or format of a plurality of separate embodiments, may also be illustratively described and presented in any suitable combination or sub-combination in the context or format of a single embodiment. Conversely, various aspects, characteristics, and features, of the present invention, which are illustratively described and presented in combination or sub-combination in the context or format of a single embodiment, may also be illustratively described and presented in the context or format of a plurality of separate embodiments.

Although the present invention has been illustratively described and presented by way of specific embodiments, and examples thereof, it is evident that many alternatives, modifications, and variations, thereof, will be apparent to those skilled in the art. Accordingly, it is intended that all such alternatives, modifications, and variations, fall within, and are encompassed by, the scope of the appended claims.

All patents, patent applications, and publications, cited or referred to in this specification are herein incorporated in their entirety by reference into the specification, to the same extent as if each individual patent, patent application, or publication, was specifically and individually indicated to be incorporated herein by reference. In addition, citation or identification of any reference in this specification shall not be construed or understood as an admission that such reference represents or corresponds to prior art of the present invention. To the extent that section headings are used, they should not be construed as necessarily limiting.

REFERENCES

1. WIPO PCT Pat. Appl. Int'l. Pub. No. WO 2008/099407, published Aug. 21, 2008, of PCT Pat. Appl. No. IL2008/000205, filed Feb. 14, 2008, of same applicant/assignee as the present invention, entitled: "Hyper-spectral Imaging And Analysis Of A Sample Of Matter, And Preparing A Solution Or Suspension Therefrom".
2. WIPO PCT Pat. Appl. Int'l. Pub. No. WO 2007/0990540, published Sep. 7, 2007, of PCT Pat. Appl. No. IL2007/000268, filed Mar. 1, 2007, of same applicant/assignee as the present invention, entitled: "Processing And Analyzing Hyper-spectral Image Data And Information Via Dynamic Database Updating".
3. U.S. Pat. No. 7,411,682, to Moshe, of same applicant/assignee as the present invention, entitled: "Real Time High Speed High Resolution Hyper-spectral Imaging".
4. U.S. Pat. No. 6,697,510, to Moshe, of same applicant/assignee as the present invention, entitled: "Method For Generating Intra-particle Crystallographic Parameter Maps And Histograms Of A Chemically Pure Crystalline Particulate Substance".
5. U.S. Pat. No. 6,694,048, to Moshe, of same applicant/assignee as the present invention, entitled: "Method For Generating Intra-particle Morphological Concentration/Density Maps And Histograms Of A Chemically Pure Particulate Substance".
6. U.S. Pat. No. 6,438,261, to Moshe, et al., of same applicant/assignee as the present invention, entitled: "Method Of In-situ Focus-Fusion Multi-layer Spectral Imaging And Analysis".
7. U.S. Pat. No. 6,091,843, to Horesh, et al., of same applicant/assignee as the present invention, entitled: "Method Of Calibration And Real-time Analysis Of Particulates".
8. U.S. Pat. No. 5,880,830, to Schechter, of same applicant/assignee as the present invention, entitled: "Spectral Imaging Method For On-line Analysis Of Polycyclic Aromatic Hydrocarbons In Aerosols".

What is claimed is:

1. A microelectromechanical system for hyper-spectral imaging and analysis, comprising:
    a plurality of microlenses arranged as a matrix having a size of about 3 mm for receiving and collimating electromagnetic radiation having a wavelength $\lambda$ emitted by objects in a scene or a sample, thereby forming a collimated object emission beam;
    a microelectromechanical Fourier optical interferometer, configured and operatively positioned relative to said matrix, for receiving and dividing said collimated object emission beam, for forming a divided collimated object emission beam having an optical path difference (OPD), and for generating an interference image exiting said optical interferometer and having a spectral resolution of about 2 nm at each pixel across the image;
    a matrix configured focusing micro lens, configured for focusing each said generated interference image;
    a micro detector, configured and operatively positioned relative to said microelectromechanical optical interferometer, and suitable for detecting and recording each said generated interference image, for forming a plurality of recorded interference images; and
    a micro central programming and control/data/information signal processing unit (micro-CPPU);
    wherein said microelectromechanical optical interferometer comprises:
        a micro beam splitter for splitting said collimated light beam into two beams;
        a pair of mirrors providing said OPD between said two beams, wherein a maximal value of said OPD is less than 10k, and wherein said pair of mirrors includes a micro fixed mirror and a micro movable mirror;
        a micro piezoelectric motor;
        a micro distance change feedback sensor; and
        a micro optical interferometer mount, configured as a mount of each of said micro beam splitter, said micro fixed mirror, said micro movable mirror, said micro piezoelectric motor, and said micro distance change feedback sensor;
    wherein said micro distance feedback sensor comprises a capacitor having a first plate and a second plate, wherein said first plate is between said micro movable mirror and said second plate, and wherein said micro movable mirror is movable toward said capacitor; and
    wherein said micro piezoelectric motor is mounted on a top surface of said mount below a lowest edge of said micro movable mirror, and wherein said micro piezoelectric motor reproducibly moves said micro movable mirror at a speed of less than a prespecified speed with nanometer accuracy, wherein the prespecified speed is 0.5 seconds per cycle;
    wherein an operative combination of said micro piezoelectric motor and said micro distance change feedback sensor allows said micro piezoelectric motor to reproducibly move said micro movable mirror with said nanometer accuracy.

2. The microelectromechanical system of claim 1, wherein said microelectromechanical optical interferometer includes:
    a micro piezoelectric motor controller, configured and operatively connected to said micro piezoelectric motor and to said micro distance change feedback sensor.

3. The system of claim 1, wherein said matrix configured collimating micro lens is configured and operatively positioned for being part of, and included in, said microelectromechanical optical interferometer.

4. The system of claim 1, wherein said micro optical interferometer mount is additionally configured and suitable as a mount of said matrix configured collimating micro lens.

* * * * *